(12) United States Patent
Zyracki et al.

(10) Patent No.: US 9,305,386 B2
(45) Date of Patent: Apr. 5, 2016

(54) EDITABLE MOTION TRAJECTORIES

(75) Inventors: Michael Zyracki, San Francisco, CA (US); Shawn McClelland, Toronto (CA)

(73) Assignee: Autodesk, Inc., San Rafael, CA (US)

(*) Notice: Subject to any disclaimer, the term of this patent is extended or adjusted under 35 U.S.C. 154(b) by 505 days.

(21) Appl. No.: 13/546,685

(22) Filed: Jul. 11, 2012

(65) Prior Publication Data

US 2013/0219344 A1    Aug. 22, 2013

Related U.S. Application Data

(60) Provisional application No. 61/600,562, filed on Feb. 17, 2012.

(51) Int. Cl.
*G06T 13/20* (2011.01)
*G06F 17/50* (2006.01)
*G06F 3/0481* (2013.01)

(52) U.S. Cl.
CPC ............. *G06T 13/20* (2013.01); *G06F 3/04815* (2013.01); *G06F 17/50* (2013.01); *G06T 2213/08* (2013.01)

(58) Field of Classification Search
CPC ...... G06F 17/50; G06F 3/04815; G06T 13/20
USPC .......................................... 715/849; 345/949
See application file for complete search history.

(56) References Cited

U.S. PATENT DOCUMENTS

| | | | |
|---|---|---|---|
| 8,164,596 B1* | 4/2012 | Bech | 345/473 |
| 2005/0156932 A1* | 7/2005 | Vienneau | G11B 27/034 |
| | | | 345/473 |
| 2006/0274070 A1* | 12/2006 | Herman | A63F 13/10 |
| | | | 345/474 |

OTHER PUBLICATIONS

Intro to Maya's Graph Editor: Animating a Dancing Flour Sack, May 25, 2010, pp. 1-7.*
https://www.youtube.com/watch?v=oYAgY6mdC5o ("Maya" © Feb. 27, 2011).*
("Kakes" Intro to Maya's Graph Editor: Animating a Dancing Flour Sack, May 25, 2010, pp. 1-7).*

* cited by examiner

*Primary Examiner* — Sherrod Keaton
(74) *Attorney, Agent, or Firm* — Fish & Richardson P.C.

(57) ABSTRACT

Methods, systems, and apparatus, including computer programs encoded on a computer storage medium, for providing a view of a three-dimensional computer animation model, the view including one or more objects, wherein each of the one or more objects is associated with a respective animation setting for adjusting a respective three-dimensional motion trajectory interpolation of the object in the computer animation model between a first and a different second key frame; receiving data describing a user interaction with a visual representation of the animation setting in the view for a first object of the one or more objects, the user interaction being an adjustment of the respective animation setting of the first object; and based on the receiving, adjusting the motion trajectory interpolation of the first object between the particular first and second key frames.

24 Claims, 15 Drawing Sheets

EDITABLE MOTION TRAJECTORIES

CROSS-REFERENCE TO RELATED APPLICATIONS

This application claims the benefit under 35 U.S.C. §119(e) of U.S. Provisional Application Ser. No. 61/600,562, filed on Feb. 17, 2012 entitled "EDITABLE MOTION TRAJECTORIES," the entirety of which is hereby incorporated by reference.

BACKGROUND

This specification relates to computer-based animation and, in particular, to editable motion trajectories.

Computer animation software can be used to create three-dimensional (3D) computer animation models for special effects, films, television programs, and interactive applications such as video games. Computer animation models can include one or more objects that are represented using a collection of points in 3D space, the points being connected by various geometric entities, e.g., triangles, lines, and curved surfaces.

SUMMARY

Animating an object in a computer animation model can be performed using key frames that define a starting position and an ending position for the object and by interpolating the object's motion trajectory and trajectory timing, e.g., the speed at which the object moves at any particular point in time, between the starting and ending positions. In other words, intermediary frames, e.g., inbetweens, can be generated to produce a smooth transition of the object from the starting position key frame to the ending position key frame. An object's position in 3D space, or world space, can be defined using x, y, and z Cartesian coordinates. The object's motion trajectory can be defined by the object's x, y, and z coordinates over a period of time.

In some instances, when animating an object in a computer animation model, e.g., a 3D computer animation model, the object's motion trajectory or trajectory timing that is interpolated between the starting and ending positions may need to be adjusted without adjusting the positions of the key frames that define the starting or ending positions. In such instances, one or more Bezier curves corresponding to the object can be manipulated to adjust the object's motion trajectory or trajectory timing at a particular point in time.

A Bezier curve, or function curve, can corresponding to an object's position on a particular x, y, and z coordinate plane, and can be used to evaluate an object's position over time in two-dimensional (2D) space, or local space, using, e.g., a 2D graph editor. Thus, for example, an object can have one Bezier curve for an object's motion trajectory along the x-axis, one Bezier curve for the object's motion trajectory along the y-axis, and one Bezier curve for the object's motion trajectory along the z-axis.

Each of the object's Bezier curves can be interpolated between the object's starting position key frame and the object's ending position key frame. The interpolation of the object's motion trajectory and trajectory timing can be adjusted using, e.g., in and out tangent handles positioned at each of the starting and ending position key frames. The interpolated Bezier curves can be used to plot the object's motion trajectory in 3D space, e.g., in a 3D viewport. Manipulation of an object's motion trajectory or trajectory timing using, e.g., the object's Bezier curves in 2D space, can be reflected in 3D space, e.g., using a 3D viewport.

In general, one aspect of the subject matter described in this specification can be embodied in a method that includes providing a view of a three-dimensional computer animation model, the view including one or more objects, wherein each of the one or more objects is associated with a respective animation setting for adjusting a respective three-dimensional motion trajectory interpolation of the object in the computer animation model between a first and a different second key frame; receiving data describing a user interaction with a visual representation of the animation setting in the view for a first object of the one or more objects, the user interaction being an adjustment of the respective animation setting of the first object; based on the receiving, adjusting the motion trajectory interpolation of the first object between the particular first and second key frames; and providing an animation of the first object in the view wherein the animation is of the first object traveling along the respective adjusted motion trajectory interpolation of the first object. Other embodiments of this aspect include corresponding systems, apparatus, and computer program products.

These and other embodiments can optionally include one or more of the following features.

Particular embodiments of the subject matter described in this specification can be implemented to realize one or more of the following advantages. In some implementations, an object's motion trajectory and trajectory timing can be manipulated using visually represented animation settings in 3D space without having to manipulate the object's Bezier curves in 2D space. Changes made to the object's motion trajectory and trajectory timing in 3D space can be mapped to the object's Bezier curves in 2D space. Similarly, changes made to the object's motion trajectory and trajectory timing using the object's Bezier curves in 2D space can be mapped to the visual representation of the object's motion trajectory and trajectory timing in 3D space.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
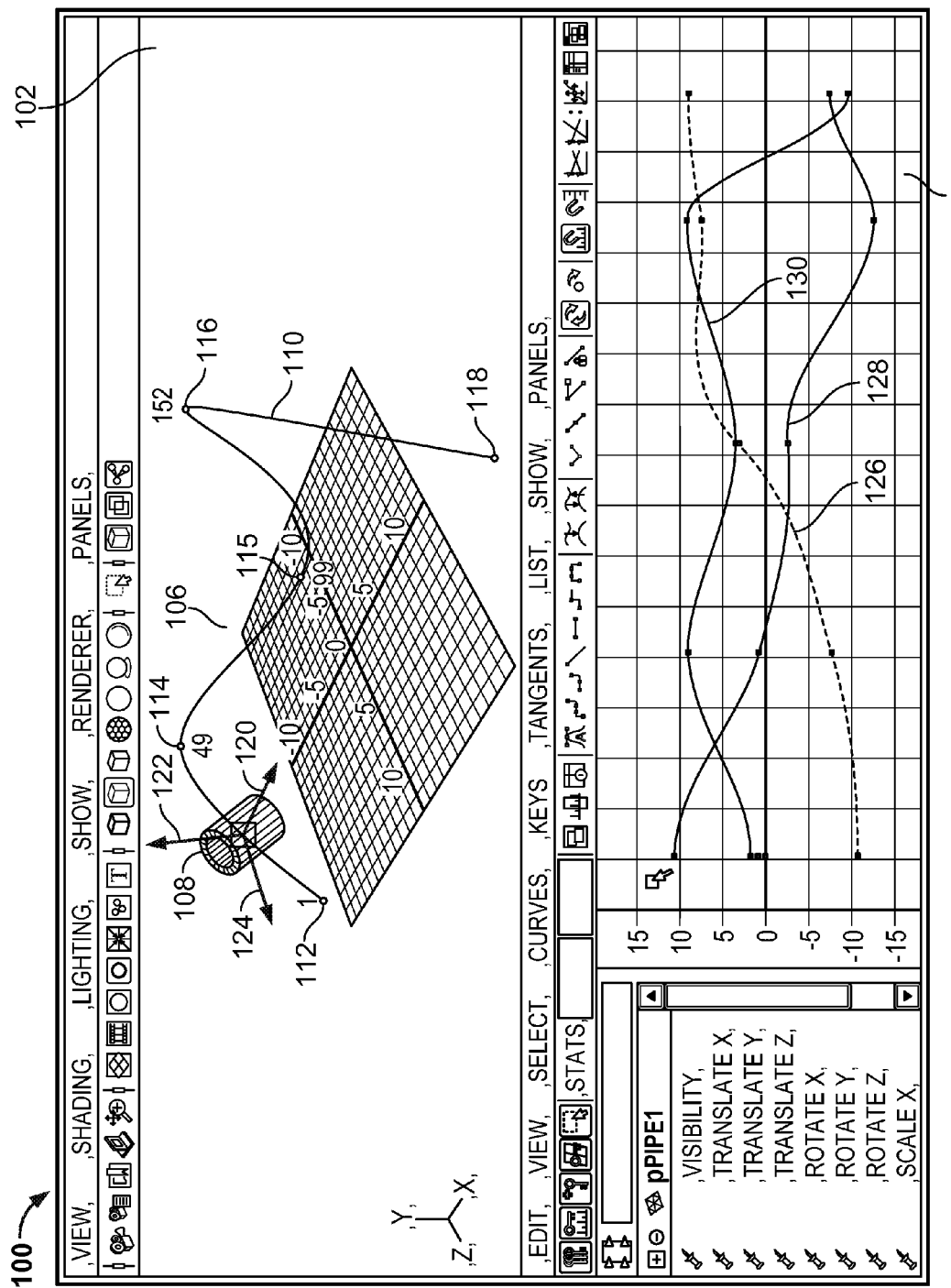
FIG. 1 is an example view of a graphical user interface presenting a view of a three-dimensional computer animation model.

FIG. 1 is an example view of a graphical user interface 100 presenting a view 102 of a 3D computer animation model. The view 102, or world space view, of the computer animation model includes a Cartesian coordinate system that can be used to define an object's 108 position in the computer animation model relative to an x, y, and z-axis. An object can be a collection of points in 3D space that are connected by one or more geometric entities, e.g., triangles, lines, and curved surfaces. Animation models can be represented using various techniques, e.g., polygonal modeling, curve modeling, character rigging, and digital sculpting. The view 102 also includes a motion trajectory trail 110 which depicts a motion trajectory of the object 108 over a period of time.

The motion trajectory trail 110 can be a sample of the object's 108 motion over time. One or more parameters can be used to indicate how much to sample over a period of time. For example, the object 108's motion can be sampled over the whole timeline or over a specified range, e.g., frames 0 to 50, in which case the motion trajectory trail 110 shows the object's 108 position from frames 0 to 50. The object 108's motion can also be sampled over some range with respect to the current time, e.g., sampling 25 frames before the current time and 25 frames after the current time. An increment parameter can be used to specify whether frames are sampled per each frame or per each half frame. For example, if frames 0 to 50 are being sampled at each half frame, then there will be 100 samples of the object's 108 position. Similarly, if frames 0 to 50 are being sampled at each frame, then there will be 50 samples of the object's 108 position.

The motion trajectory trail 110 includes points 112, 114, 115, 116, and 118 that represent key frames in the computer animation model. A key frame number corresponding to the points 112, 114, 115, 116, and 118 can be presented. For example, the view 102 depicts key frame numbers 1, 49, 99, and 152 for points 112, 114, 115, and 116.

The object 108 is depicted with vectors 120, 122, and 124 that corresponding to an x, y, and z-axis in a Cartesian coordinate system. The object 108 can be moved, e.g., by dragging the object 108 using a mouse pointer, along the motion trajectory trail 110 by moving the object 108 in a direction indicated by the vectors 120, 122, and 124, respectively.

The graphical user interface 100 also includes a second region 104, e.g., a 2D graph editor, depicting the object's 108 motion trajectory and trajectory timing in 2D space, or local space. The 2D graph editor 104 can be used to evaluate the object's 108 position over time in 2D space. The 2D graph editor 104 depicts the object's 108 Bezier curves 126, 128, and 130 representing the object's motion trajectory over a period of time, e.g., trajectory timing, in 2D space. The Bezier curves 126, 128, and 130 are depicted as representing the object's position along the x, y, and z-axis, respectively. In some implementations, the object's 108 Bezier curves 126, 128, and 130 can be mapped to the visual representation of the object's motion trajectory trail 110 and trajectory timing in the view 102.

Figure 2:
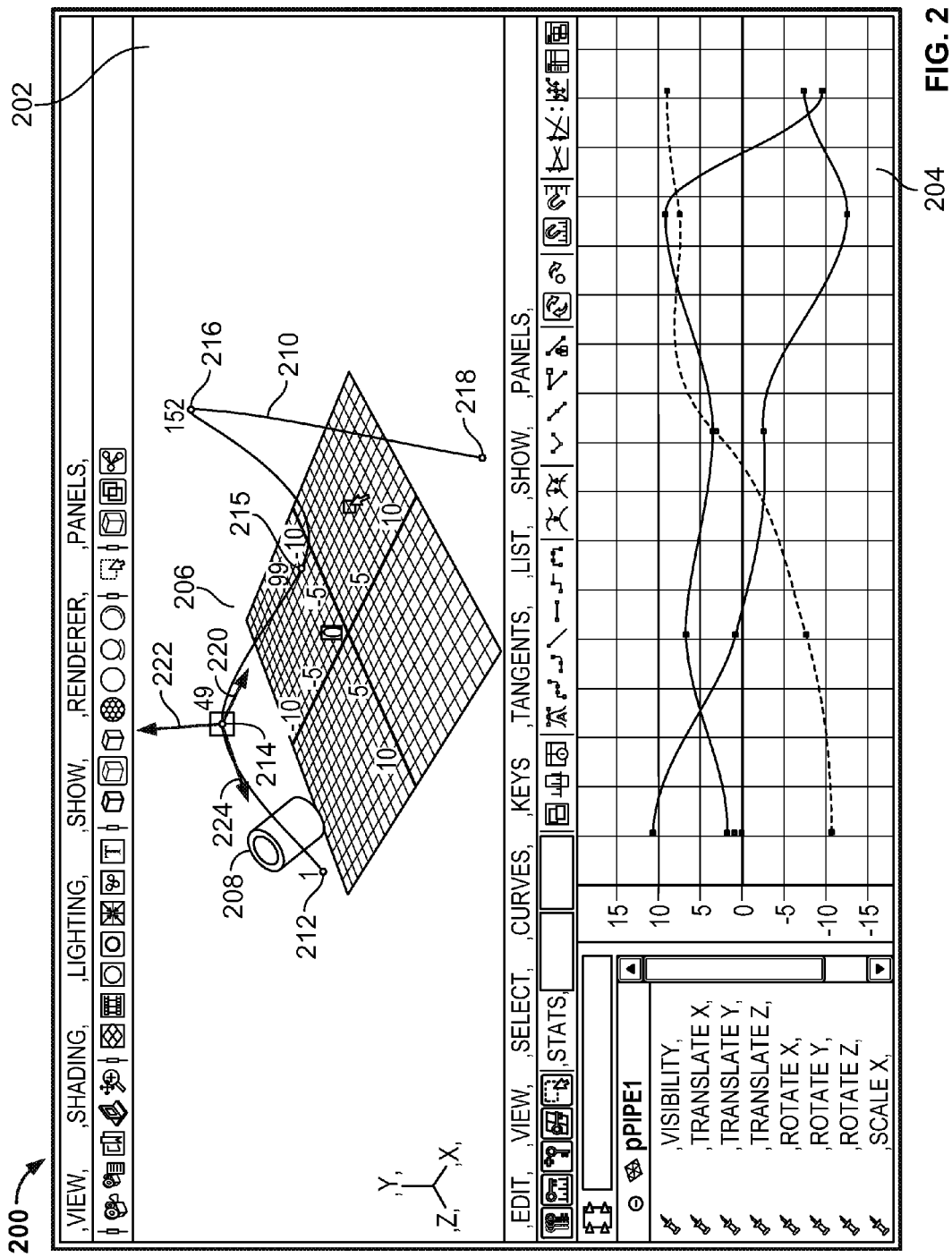
FIG. 2 is an example view of a graphical user interface presenting a view of a three-dimensional computer animation model depicting selection of a key frame.

FIG. 2 is an example view of a graphical user interface 200 presenting a view 202 of a 3D computer animation model depicting selection of a key frame 214. The view 202 of the computer animation model includes a Cartesian coordinate system that can be used to define the object's 208 position in the computer animation model relative to an x, y, and z-axis. The view 102 also includes a motion trajectory trail 210 of the object 208 which depicts a motion trajectory of the object 208 over a period of time. The motion trajectory trail 210 includes points 212, 214, 215, 216, and 218 that represent key frames in the computer animation model.

Each of the points 212, 214, 215, 216, and 218 can be moved, e.g., using a mouse pointer, along an x, y, and z-axis to modify the object's 208 position in the corresponding key frame in the computer animation model. For example, the point 214 is depicted with vectors 220, 222, and 224 that correspond to an x, y, and z-axis in a Cartesian coordinate system. The point 214 can be moved, e.g., by dragging the point 214 using a mouse pointer, in a direction indicated by the vectors 120, 122, and 124. As a result, the position of the object 208 can be adjusted at the key frame corresponding to point 214.

Figure 3:
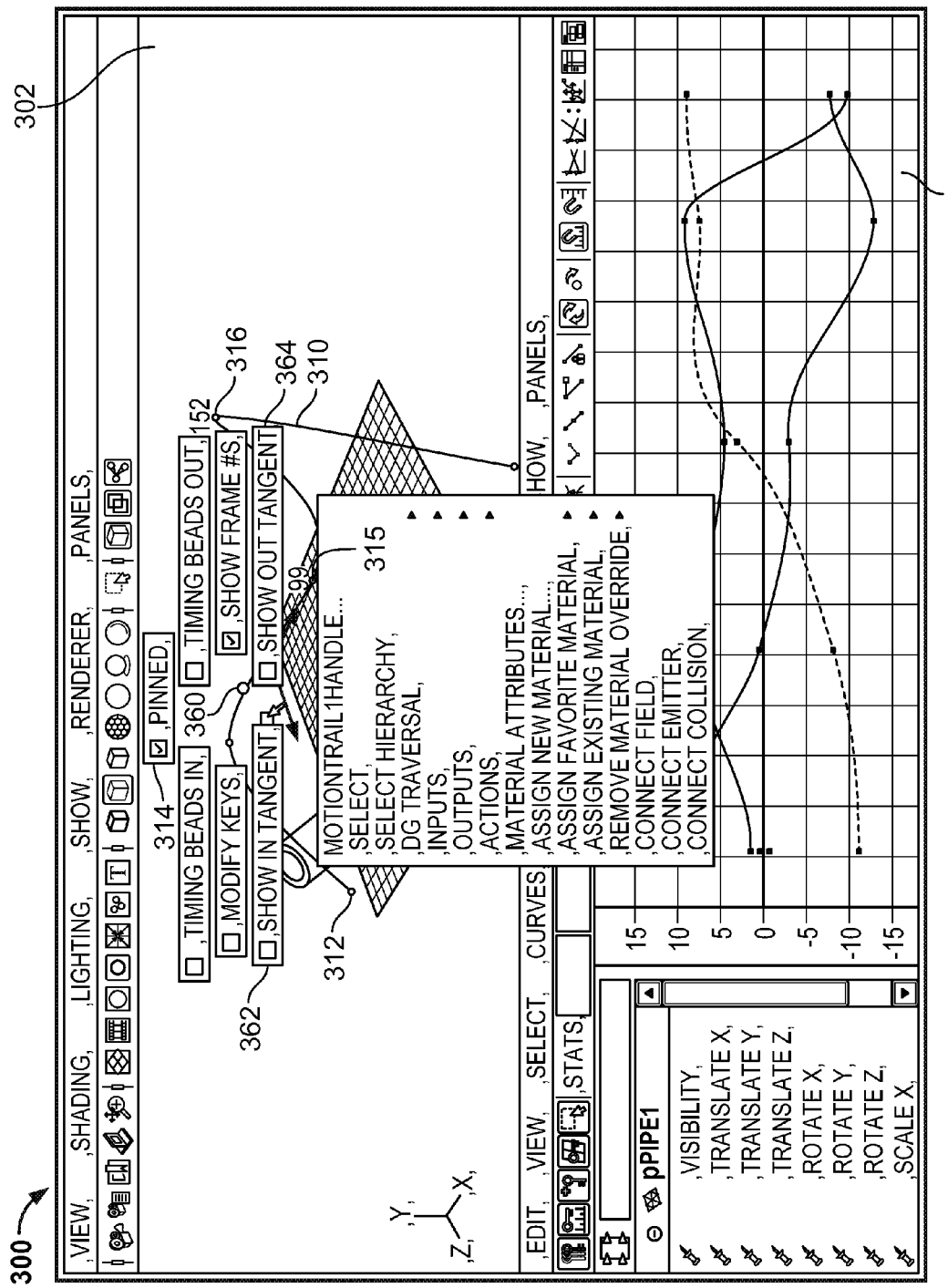
FIG. 3 is an example view of a graphical user interface presenting a view of a three-dimensional computer animation model depicting activation of tangent handles at a position.

FIG. 3 is an example view of a graphical user interface 300 presenting a view 302 of a 3D computer animation model depicting activation of tangent handles 362 and 364. The tangent handles 362 and 364 are depicted as being activated at a position 360 on the motion trajectory trail 310. A user can adjust an object's motion trajectory by selecting a position on the object's motion trajectory trail 310. The user can activate one or more tangent handles 362 and 364 at the selected position by selecting the "Show In Tangent" or the "Show Out Tangent" options, respectively. Tangent handles can be used to adjust an object's motion trajectory as the object travels along the motion trajectory trail 310. In particular, tangent handles can allow adjustment of an object's motion trajectory without having to adjust key frames, e.g., points 312, 314, 315, and 316.

In some implementations, the user can activate an "in" tangent handle 362 that corresponds to the selected position 360. An "in" tangent handle can originate from the nearest key frame point 314 preceding the selected position 360. The "in" tangent handle can be used to manipulate an object's motion trajectory as the object travels from the key frame point 314 preceding the selected position 360 to the selected position 360. The user can also activate an "out" tangent handle 364 that corresponds to the selected position 360. An "out" tangent handle can originate from the nearest key frame point 315 subsequent to the selected position 360. The "out" tangent handle can be used to manipulate an object's motion trajectory as the object travels from the selected position 360 to the key frame point 315 subsequent to the selected position 360.

Figure 4:
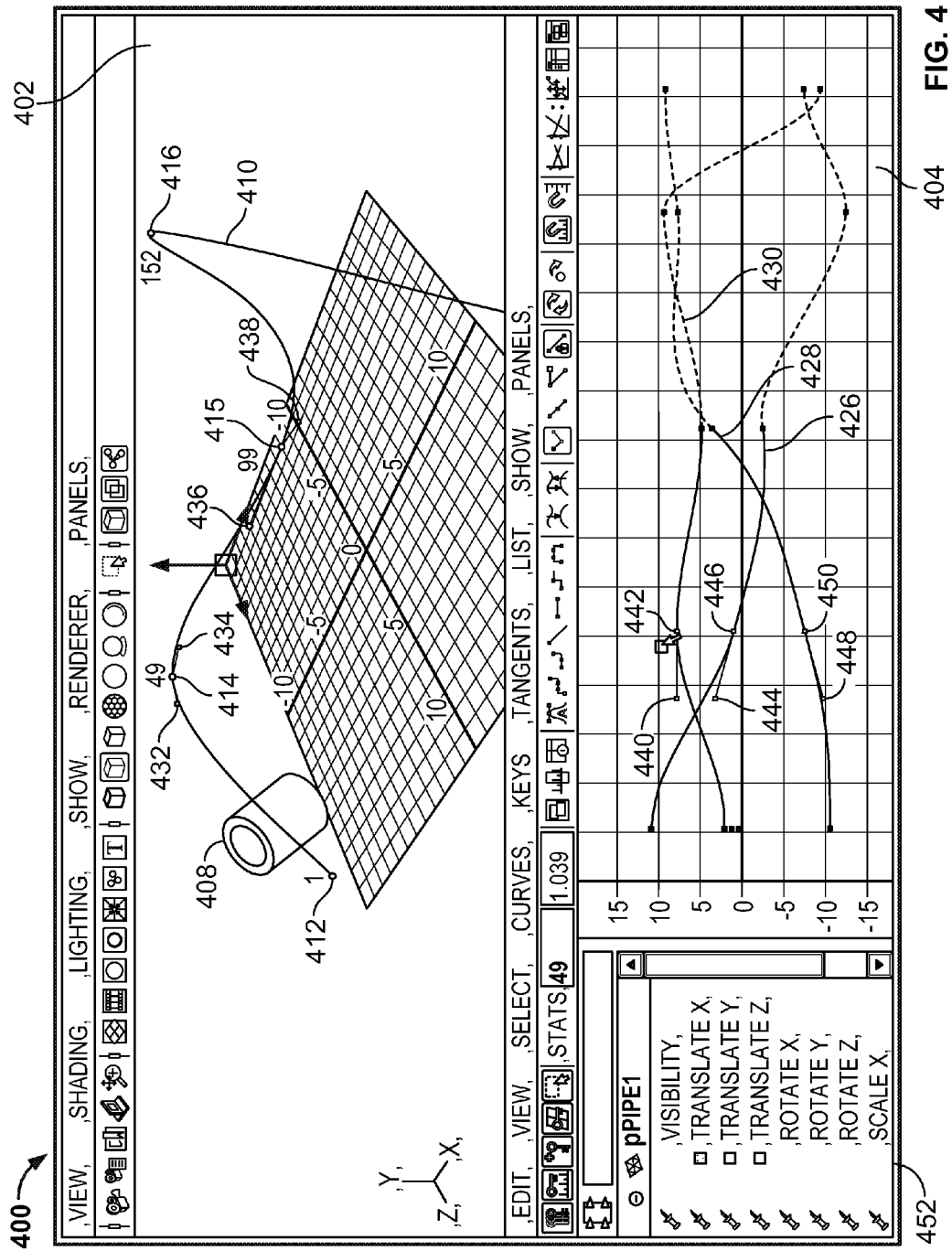
FIG. 4 is an example view of a graphical user interface presenting a view of a three-dimensional computer animation model depicting tangent handles.

FIG. 4 is an example view of a graphical user interface 400 presenting a view 402 of a 3D computer animation model depicting tangent handles 432, 434, 436, and 438. The view 402 also includes a motion trajectory trail 410 which depicts a motion trajectory of the object 408 over a period of time. The motion trajectory trail 410 includes points 412, 414, 415, and 416 that represent key frames in the computer animation model.

The "in" tangent handle 432 and "out" tangent handle 434 correspond to the key frame point 414. The angle of the "in" tangent handle 432 can be adjusted to manipulate the object's 408 motion trajectory as the object 408 travels along the motion trajectory trail 410 from the key frame point 412 toward the key frame point 414. Similarly, the angle of the "out" tangent handle 434 can be adjusted to manipulate the object's 408 motion trajectory as the object 408 travels along the motion trajectory trail 410 from the key frame point 414 toward key frame point 415.

FIG. 4 also depicts an "in" tangent handle 436 and an "out" tangent handle 438 corresponding to the key frame point 415. Similar to the operation described with respect to key frame point 414, the angle of the "in" tangent handle 436 can be adjusted to manipulate the object's 408 motion trajectory as the object 408 travels along the motion trajectory trail 410 from the key frame point 414 toward the key frame point 415. The angle of the "out" tangent handle 438 can be adjusted to manipulate the object's 408 motion trajectory as the object 408 travels along the motion trajectory trail 410 from the key frame point 415 toward key frame point 416.

The graphical user interface 400 also includes a 2D graph editor 404 depicting the object's 408 motion trajectory and trajectory timing in two-dimensional 2D space, or local space. The 2D graph editor 404 can be used to evaluate the object's 408 position over time in 2D space. The 2D graph editor 404 depicts the object's 408 Bezier curves 426, 428, and 430 representing the object's motion trajectory over a period of time in 2D space. The Bezier curves 426, 428, and 430 are depicted as representing the object's position along the x, y, and z-axis, respectively.

In some implementations, the object's 408 motion trajectory can be manipulated using one or more tangent handles corresponding to the Bezier curves 426, 428, and 430 using the 2D graph editor 404. The user can select one or more of the "in" tangent handles 440, 444, and 448 or the "out" tangent handles 442, 446, and 450 to adjust the object's motion trajectory along one or more axis on the Cartesian coordinate system presented in the view 402.

For example, the "in" and "out" tangent handles 444 and 446, respectively, corresponding to Bezier curve 426 can be used to manipulate the object's 408 position relative to the x-axis on the Cartesian coordinate system presented in the view 402. The "in" and "out" tangent handles 448 and 450, respectively, corresponding to Bezier curve 428 can be used to manipulate the object's 408 position relative to the y-axis on the Cartesian coordinate system presented in the view 402. Similarly, the "in" and "out" tangent handles 440 and 442, respectively, corresponding to Bezier curve 430 can be used to manipulate the object's 408 position relative to the z-axis on the Cartesian coordinate system presented in the view 402. In some implementations, a window 452 can present information indicating which Bezier curves 426, 428, and 430 is being adjusted using the 2D graph editor 404.

Figure 5:
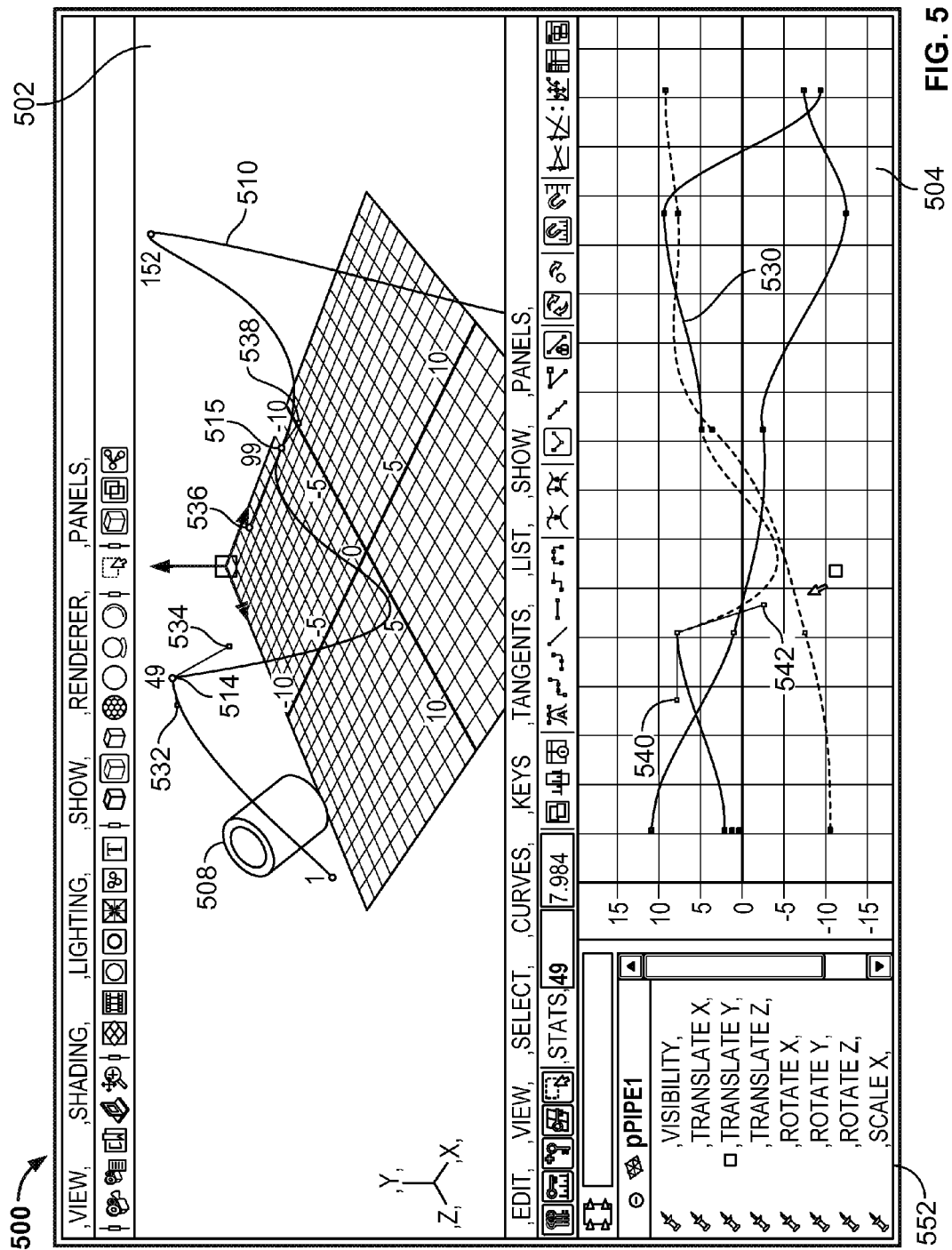
FIG. 5 is an example view of a graphical user interface presenting a view of a three-dimensional computer animation model depicting manipulation of an object's motion trajectory using a two-dimensional view editor.

FIG. 5 is an example view of a graphical user interface 500 presenting a view 502 of a 3D computer animation model depicting manipulation of an object's motion trajectory trail 510 using a 2D graph editor 504. The view 502 includes a motion trajectory trail 510 which depicts a motion trajectory of the object 508 over a period of time. The motion trajectory trail 510 includes an "in" tangent handle 532 and "out" tangent handle 534 that correspond to the key frame point 514. The motion trajectory trail 510 also includes an "in" tangent handle 536 and an "out" tangent handle 538 that correspond to the key frame point 515.

The graphical user interface 500 also includes a 2D graph editor 504 depicting the object's 508 motion trajectory and trajectory timing in two-dimensional (2D) space, or local space. The 2D graph editor 504 can be used to evaluate the object's 508 position over time in 2D space. The 2D graph editor 504 depicts an "in" tangent handle 540 and an "out" tangent handle 542 corresponding to the Bezier curve 530. In some implementations, the object's 508 motion trajectory can be manipulated using one or more tangent handles corresponding to Bezier curves using the 2D graph editor 504.

FIG. 5 depicts an adjustment to the Bezier curve 530, which corresponds to the object's 508 position relative to the z-axis on the Cartesian coordinate system presented in the view 502. In particular, the "out" tangent handle 542, which corresponds to a position between key frame points 514 and 515 in the view 502, is depicted as having been adjusted, e.g., by dragging the "out" tangent handle 542 using a mouse pointer. In some implementations, adjustments made to the object's 508 Bezier curves are mapped to the visual representation of the object's motion trajectory trail 510 in the view 502. Thus, as a result of adjusting the Bezier curve 530, the object's 508 motion trajectory trail 510 has been adjusted between key frame points 514 and 515.

Figure 6:
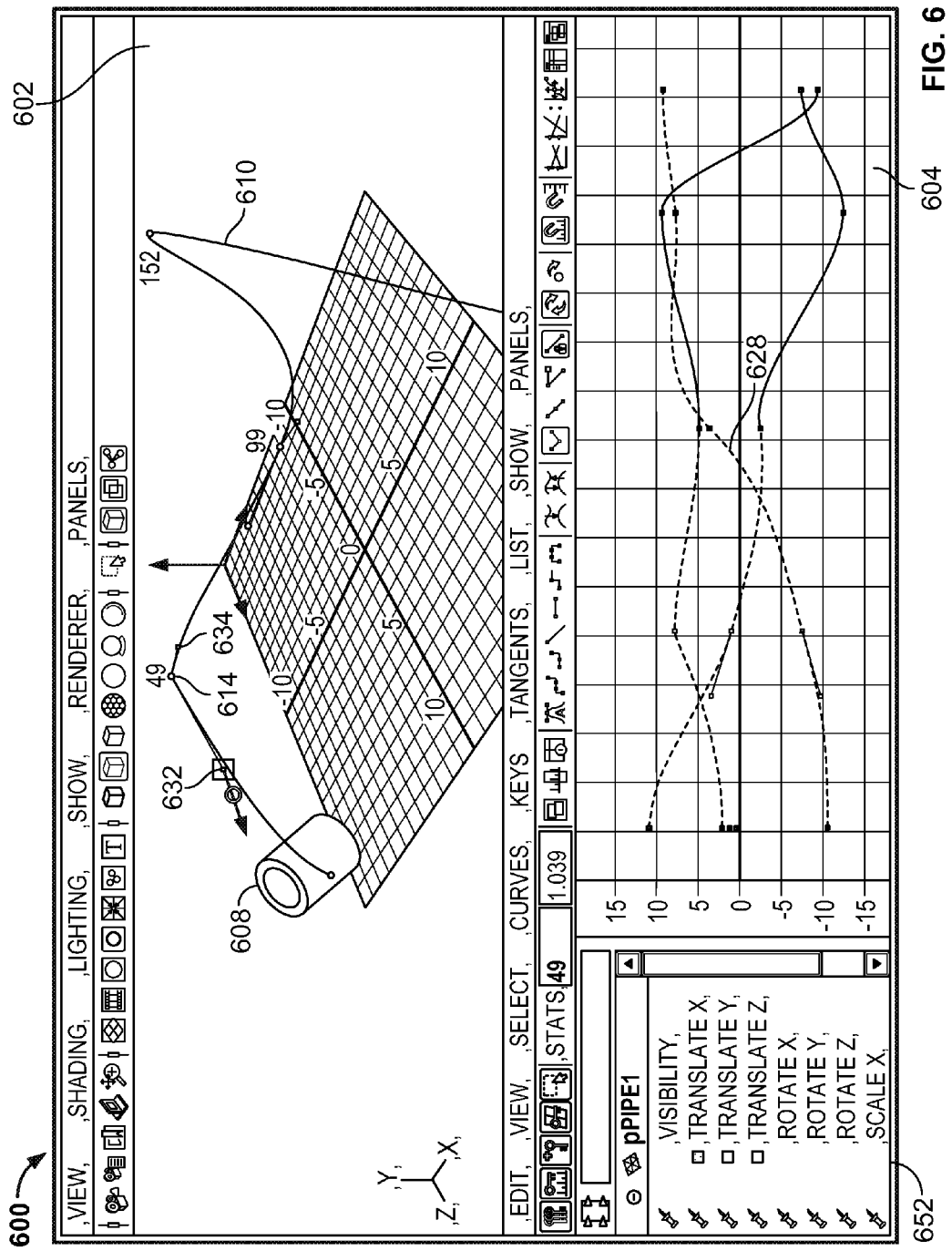
FIG. 6 is an another example view of a graphical user interface presenting a view of a three-dimensional computer animation model depicting manipulation of an object's motion trajectory using the view of the three-dimensional computer animation model.

FIG. 6 is an example view of a graphical user interface 600 presenting a view 602 of a 3D computer animation model depicting manipulation of an object's motion trajectory using the view of the computer animation model. The view 602 includes a motion trajectory trail 610 which depicts a motion trajectory of the object 608 over a period of time. The motion trajectory trail 610 includes an "in" tangent handle 632 and "out" tangent handle 634 that correspond to the key frame point 614.

The graphical user interface 600 also includes a 2D graph editor 604 depicting the object's 608 motion trajectory and trajectory timing in two-dimensional (2D) space, or local space. Bezier curves corresponding to the object 608 can be presented in the 2D graph editor 604 and can be used to evaluate the object's 608 position over time in 2D space. In some implementations, the object's 608 motion trajectory can be manipulated using visual representations of one or more tangent handles corresponding to a key frame point in the view 602.

In FIG. 6, the "in" tangent handle 632 corresponding to the key frame point 614 is depicted as being adjusted, e.g., by dragging the "in" tangent handle 632 using a mouse pointer, along the y-axis in the Cartesian coordinate system presented in the view 602. In some implementations, adjustments made to the visual representation of the object's 608 motion trajectory trail 610 in the view 602 are mapped to the Bezier curves corresponding to the object 608 in the 2D graph editor 604. Thus, in FIG. 6, the Bezier curve 628, which corresponds to the object's 608 position relative to the y-axis in the Cartesian coordinate system presented in the view 602, is adjusted accordingly based on the adjustments made to the "in" tangent handle 632 in the view 602.

Figure 7:
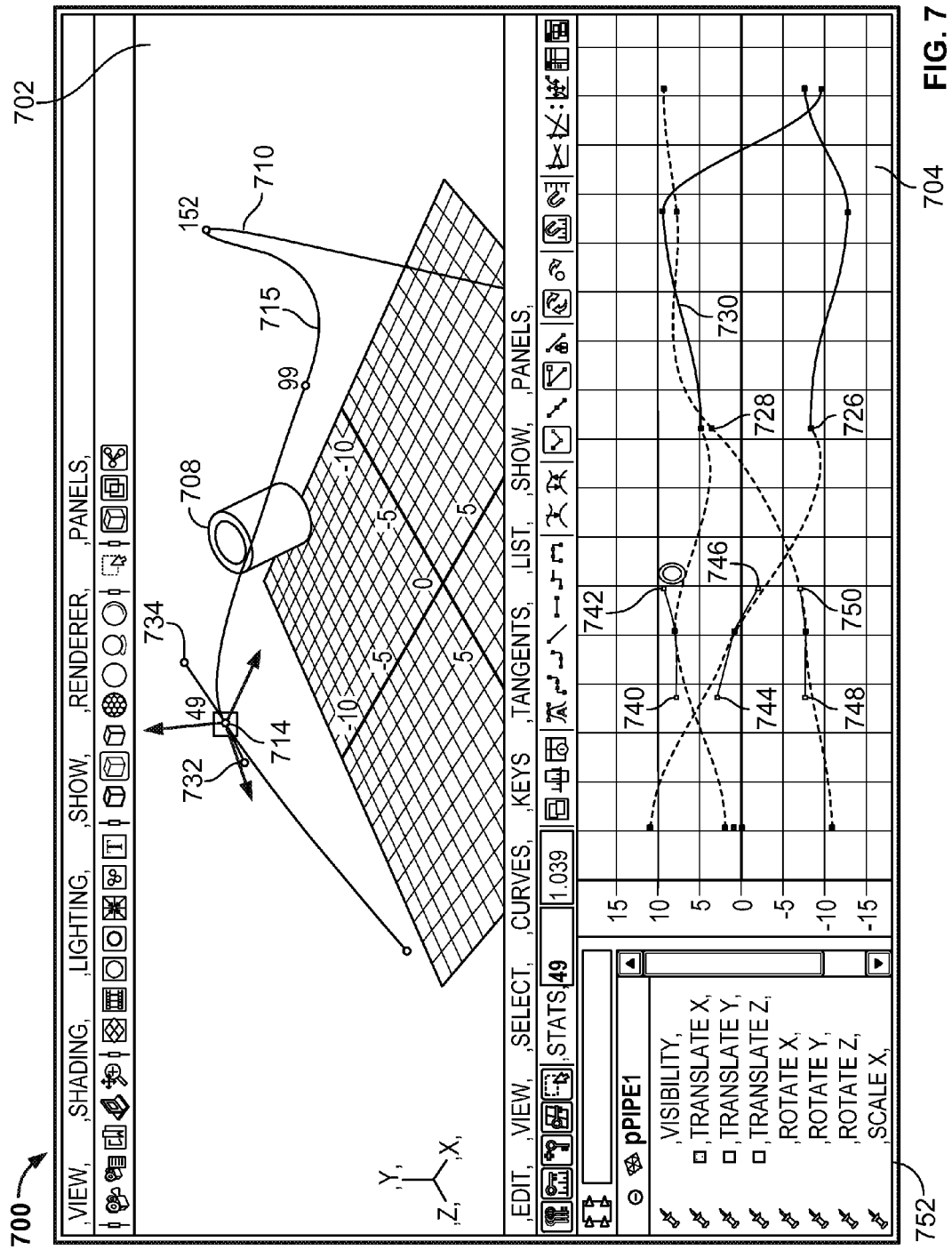
FIG. 7 is an example view of a graphical user interface depicting manipulation of an object's motion trajectory using multiple tangent handles associated with Bezier curves.

FIG. 7 is an example view of a graphical user interface 700 depicting manipulation of an object's motion trajectory using multiple tangent handles associated with Bezier curves 726, 728, and 730. The graphical user interface 700 includes a view 702 of a 3D computer animation model. The view 702 includes a motion trajectory trail 710 which depicts a motion trajectory of the object 708 over a period of time. The motion trajectory trail 710 includes an "in" tangent handle 732 and "out" tangent handle 734 that correspond to the key frame point 714.

The graphical user interface 700 also includes a 2D graph editor 704 depicting the object's 708 motion trajectory and trajectory timing in two-dimensional (2D) space, or local space. The 2D graph editor 704 can be used to evaluate the object's 708 position over time in 2D space. In some implementations, the Bezier curves presented in the 2D graph editor 704 can be adjusted to manipulate an object's 708 motion trajectory trail. Changes made to the object's 708 motion trajectory trail in the 2D graph editor 704 can be reflected in the object's 708 motion trajectory trail 710 in the view 702.

For example, the "in" and "out" tangent handles 744 and 746, respectively, corresponding to Bezier curve 726 can be used to manipulate the object's 708 position relative to the x-axis on the Cartesian coordinate system presented in the view 702. The "in" and "out" tangent handles 748 and 750, respectively, corresponding to Bezier curve 728 can be used to manipulate the object's 708 position relative to the y-axis on the Cartesian coordinate system presented in the view 702. Similarly, the "in" and "out" tangent handles 740 and 742, respectively, corresponding to Bezier curve 730 can be used to manipulate the object's 708 position relative to the z-axis on the Cartesian coordinate system presented in the view 702. In some implementations, a window 752 can present information indicating which Bezier curves 726, 728, and 730 is being adjusted using the 2D graph editor 704.

FIG. 7 depicts an adjustment to the Bezier curves 726, 728, and 730, which correspond to the object's 708 position relative to the x, y, and z-axis on the Cartesian coordinate system presented in the view 702. In particular, the "out" tangent handles 742, 746, and 750, which correspond to a position between key frame points 714 and 715 in the view 702, is depicted as having been adjusted, e.g., by selecting all three "out" tangent handles 742, 746, and 750 and by dragging the selected "out" tangent handles 742, 744, and 746 using a mouse pointer. In some implementations, adjustments made to the object's 708 Bezier curves are mapped to the visual representation of the object's motion trajectory trail 710 in the view 702. Thus, as a result of adjusting the Bezier curves 726, 728, and 730, the object's 708 motion trajectory trail 710 has been adjusted between key frame points 714 and 715.

Figure 8:
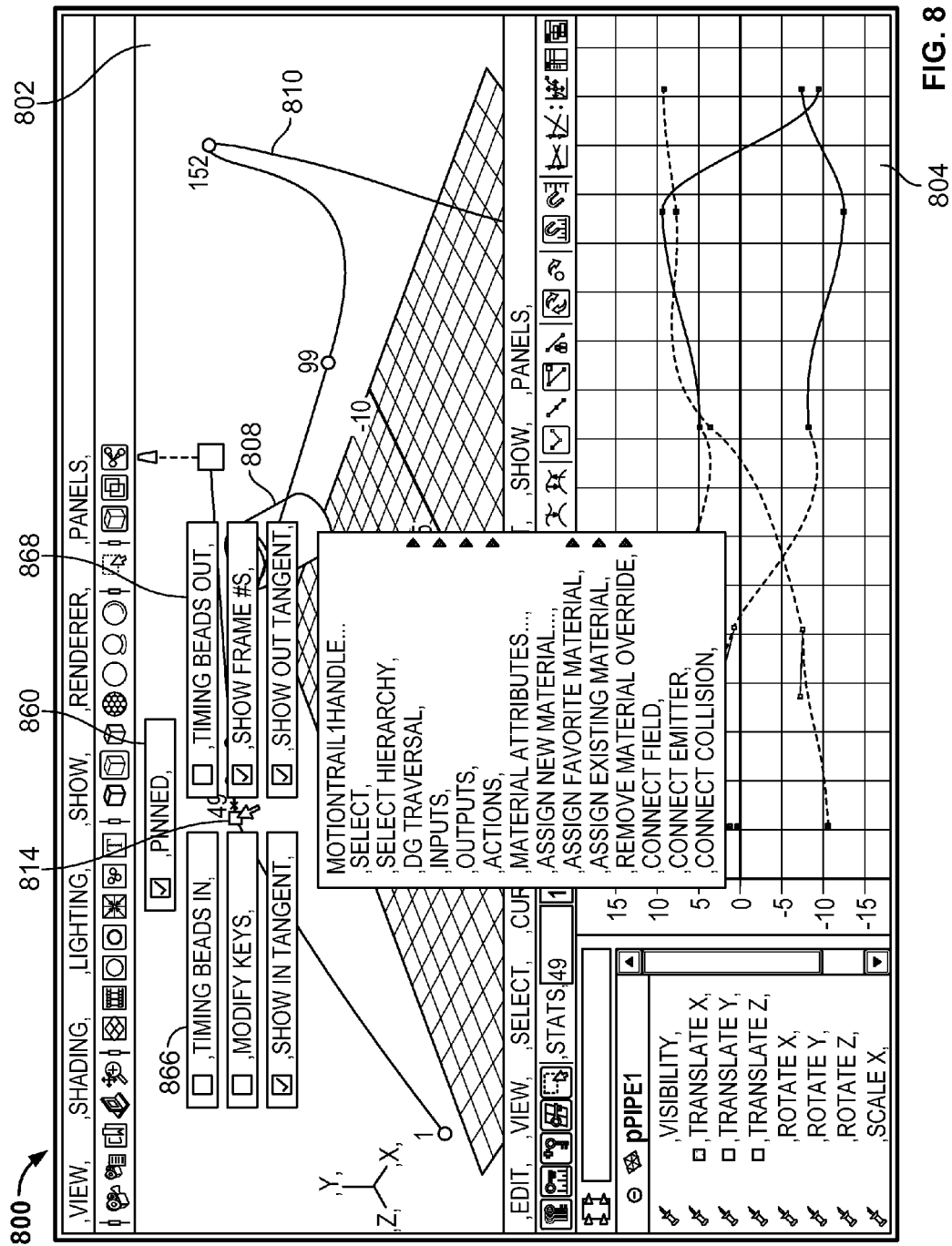
FIG. 8 is an example view of a graphical user interface presenting a view of a three-dimensional computer animation model depicting activation of timing beads at a selected key frame.

FIG. 8 is an example view of a graphical user interface 800 presenting a view 802 of a 3D computer animation model depicting activation of timing beads 866 and 868 at a selected key frame point 814. The timing beads 866 and 868 are depicted as being activated at a key frame point 814 on the motion trajectory trail 810. The user can activate one or more timing beads 866 and 868 at the key frame point 814 by selecting the "Timing Beads In" or the "Timing Beads Out" options, respectively, in the menu 860. Timing beads can be used to adjust an object's motion trajectory time, e.g., the speed the object 808 travels across a particular segment in the motion trajectory trail 810.

In some implementations, the user can activate "in" timing beads for a position 814 located along the motion trajectory trail 810. "In" timing beads 866 corresponding to a particular point 814 can be used to adjust an object's 808 trajectory time as the object 808 approaches the particular point 814 while traveling along the motion trajectory trail 810. The user can also activate "out" timing beads 868 for a position 814 located along the motion trajectory trail 810. "Out" timing beads 868 corresponding the particular point 814 can be used to adjust the object's 808 trajectory time as the object 808 travels from the particular point 814 along the motion trajectory trail 810.

Figure 9:
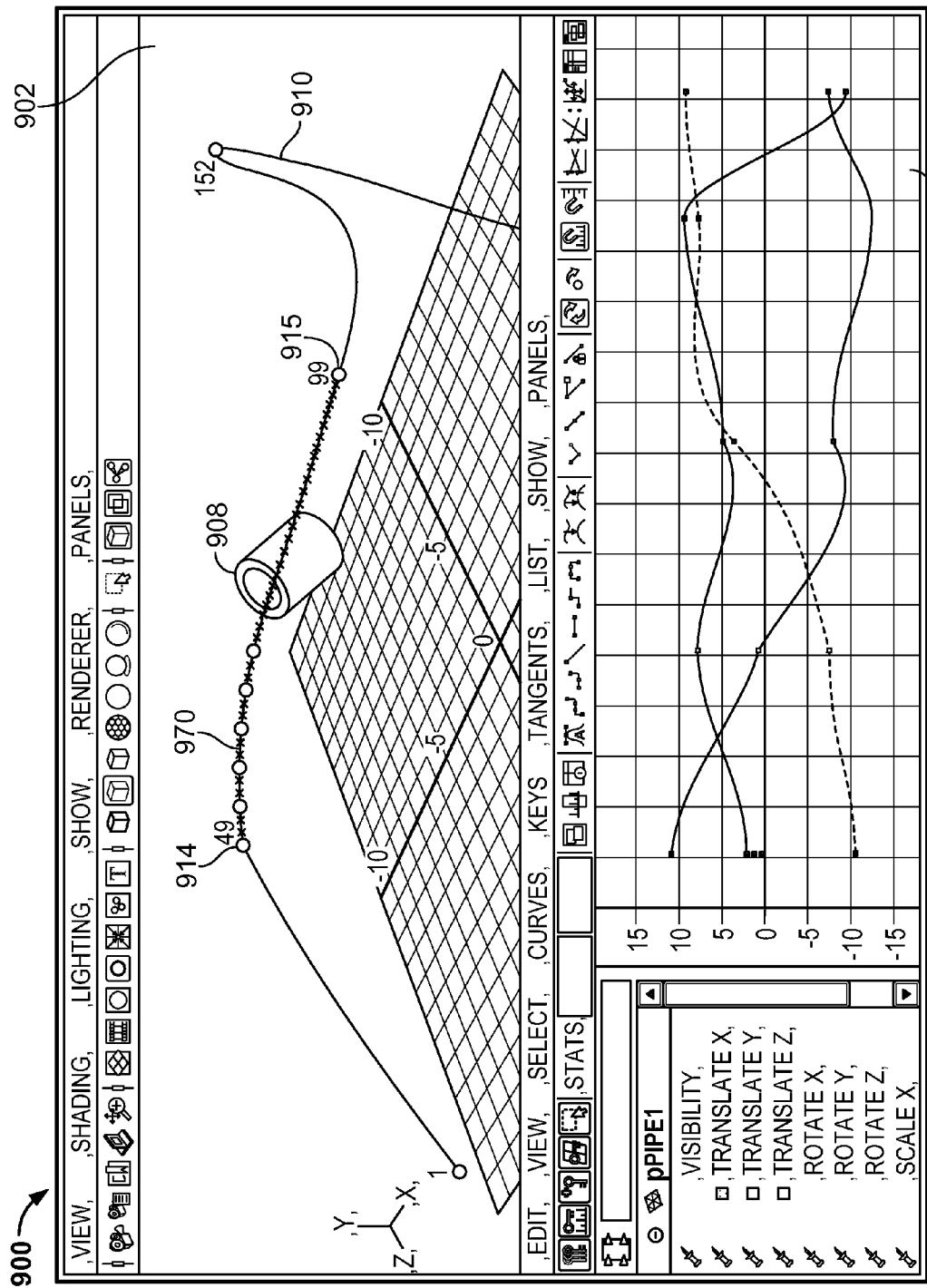
FIG. 9 is an example view of a graphical user interface presenting a view of a three-dimensional computer animation model depicting timing beads.

FIG. 9 is an example view of a graphical user interface 900 presenting a view of a 3D computer animation model depicting timing beads 970. The "out" timing beads 970 are depicted as originated from the key frame point 914 and progressing toward the subsequent key frame point 915. A user can manipulate an object's 908 motion trajectory timing by sliding the timing beads 970, e.g., by dragging the timing beads 970 using a mouse pointer, toward the key frame point 914 from which the timing beads 970 originate, or toward the subsequent key frame point 915.

In some implementations, sliding the timing beads 970 toward the key frame point 914 from which the timing beads 970 originate can decrease the speed the object 908 travels across the motion trajectory trail 910, beginning from the key frame point 914 and moving toward the key frame point 915. Alternatively, sliding the timing beads 970 toward the subsequent key frame point 915 can increase the speed the object 908 travels across the motion trajectory trail 910, beginning from the key frame point 914 and moving toward the key frame point 915. Depending on the configuration, two or more timing beads can be presented and used for adjustment of an object's motion trajectory timing along a particular segment in a motion trajectory trail.

Figure 10:
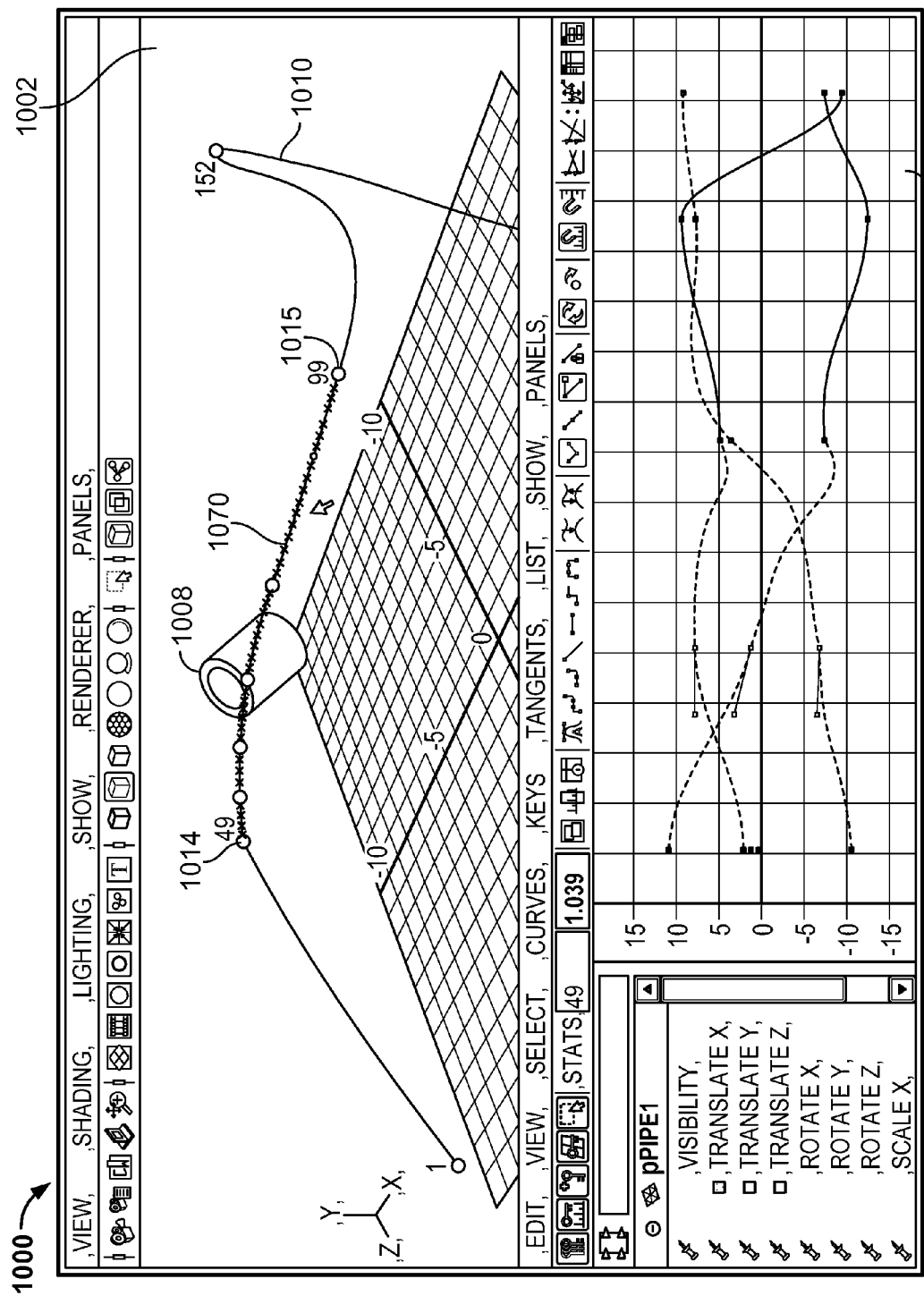
FIG. 10 is an example view of a graphical user interface presenting a view of a three-dimensional computer animation model depicting manipulation of an object's trajectory timing using timing beads.

FIG. 10 is an example view of a graphical user interface 1000 presenting a three-dimensional view of a computer animation model depicting manipulation of an object's 1008 trajectory timing using timing beads 1070. In FIG. 10, the "out" timing beads 1070 are depicted as originated from the key frame point 1014 and progressing toward the subsequent key frame point 1015. The object's 1008 motion trajectory timing is depicted as having been adjusted by sliding the timing beads 1070, e.g., by dragging the timing beads 1070 using a mouse pointer, toward the subsequent key frame point 1015. As a result of sliding the timing beads 1070 toward the subsequent key frame point 1015, the speed of the object 1008 decreases as the object 908 travels across the motion trajectory trail 1010, beginning from the key frame point 1014 and moving toward the key frame point 1015.

In some implementations, a user can activate timing beads corresponding to the subsequent key frame position 1015. For example, the user can activate "in" timing beads that originate from the subsequent key frame point 1015. The "in" timing beads for the subsequent key frame position 1015 can be used to adjust the speed the object 1008 travels along the motion trajectory trail 1010 as the object 1008 approaches the subsequent key frame position 1015.

In some implementations, changes made to the object's 1008 motion trajectory time in the view 1002 can be mapped to the object's 1008 Bezier curves presented in a two-dimensional view 1004, e.g., a 2D graph editor, where the Bezier curves correspond to the object's 1008 position relative to an x, y, and z-axis in the Cartesian coordinate system presented in the view 902 over a particular period of time.

Figure 11:
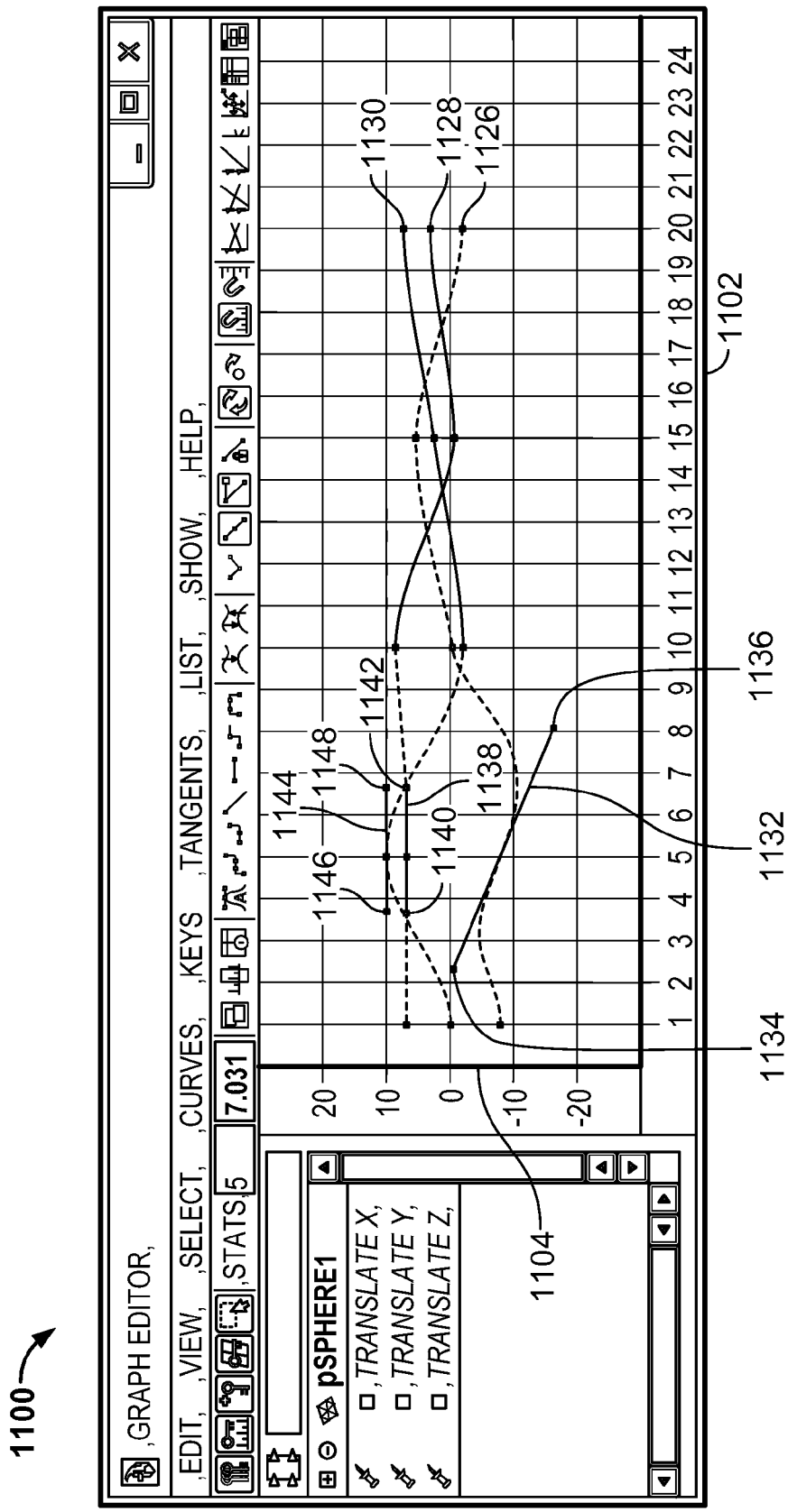
FIG. 11 is an example view of a graphical user interface presenting a two-dimensional view of a computer animation model.

FIG. 11 is an example view of a graphical user interface 1100 presenting a two-dimensional (2D) view of a computer animation model. The graphical user interface 1100 includes a 2D graph editor depicting an object's motion trajectory and trajectory timing in 2D space, or local space. The 2D graph editor can be used to evaluate the object's position over time in 2D space. The 2D graph editor depicts the object's Bezier curves 1126, 1128, and 1130 representing the object's motion trajectory over a period of time, e.g., trajectory timing, in 2D space. The graph editor plots a local value corresponding to the Bezier curves 1126, 1128, and 1130 along the y-axis 1104 and a time value corresponding to the Bezier curves 1126, 1128, and 1130 along the x-axis 1102.

In particular, FIG. 11 depicts tangent handles 1132, 1138, and 1144 that correspond to the Bezier curves 1126, 1128, and 1130, respectively. The length of the tangent handles 1132, 1138, and 1144 can be used to measure a motion trajectory timing for the object along a particular x, y, or z-axis in the Cartesian coordinate system. For example, the length of the tangent handle 1132 is calculated beginning from a first position 1132, which is depicted as corresponding to a time value of 2.2 seconds, to a second position 1136, which is depicted as corresponding to a time value of 8 seconds. The first position 1132 represents a minimum time value for the tangent handle 1132 and the second position 1136 represents a maximum time value for the tangent handle 1132.

Figure 12:
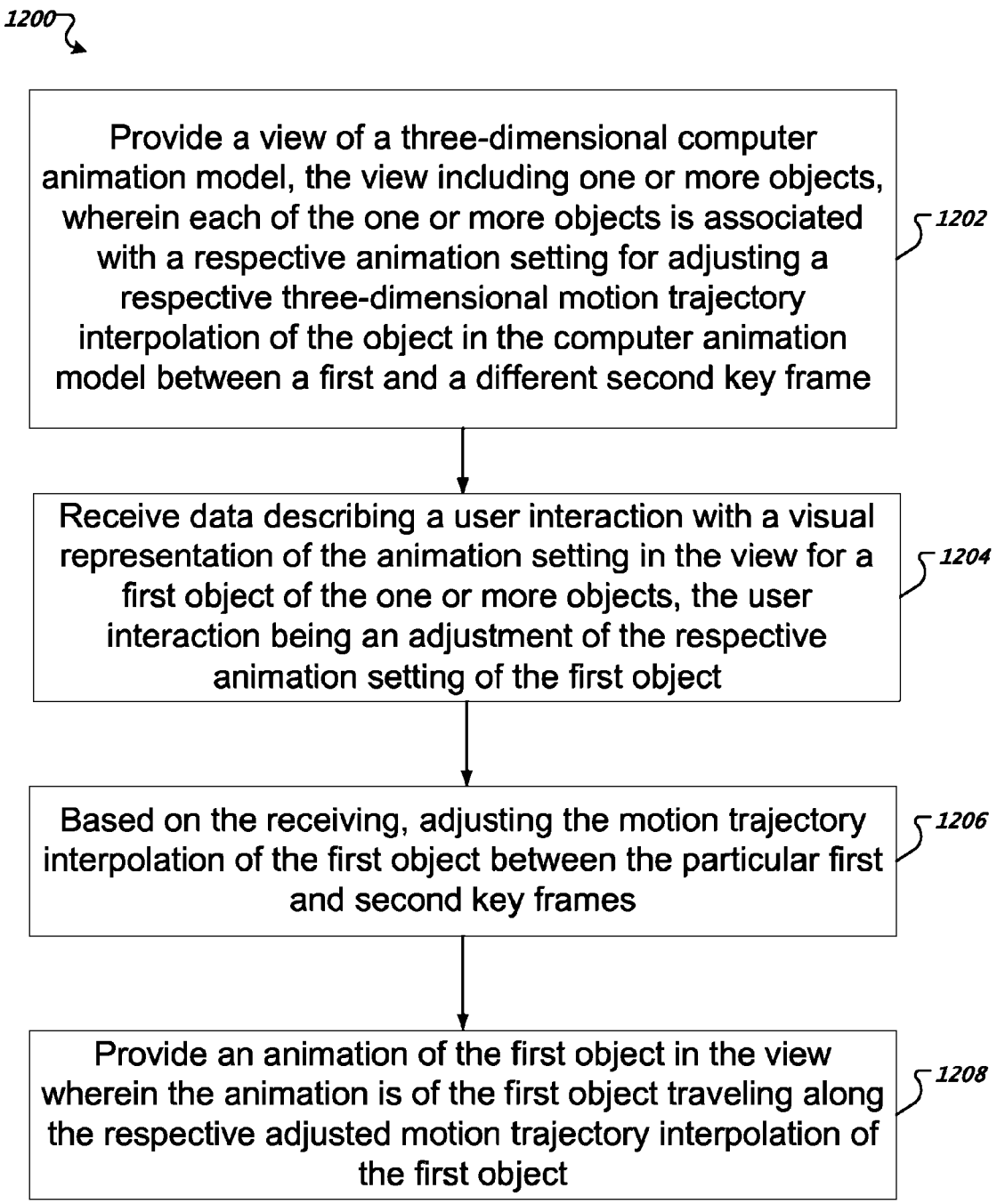
FIG. 12 is a flow diagram illustrating an example process for manipulating an object's motion trajectory and trajectory timing in a view of a three-dimensional computer animation model.
Figure 15:
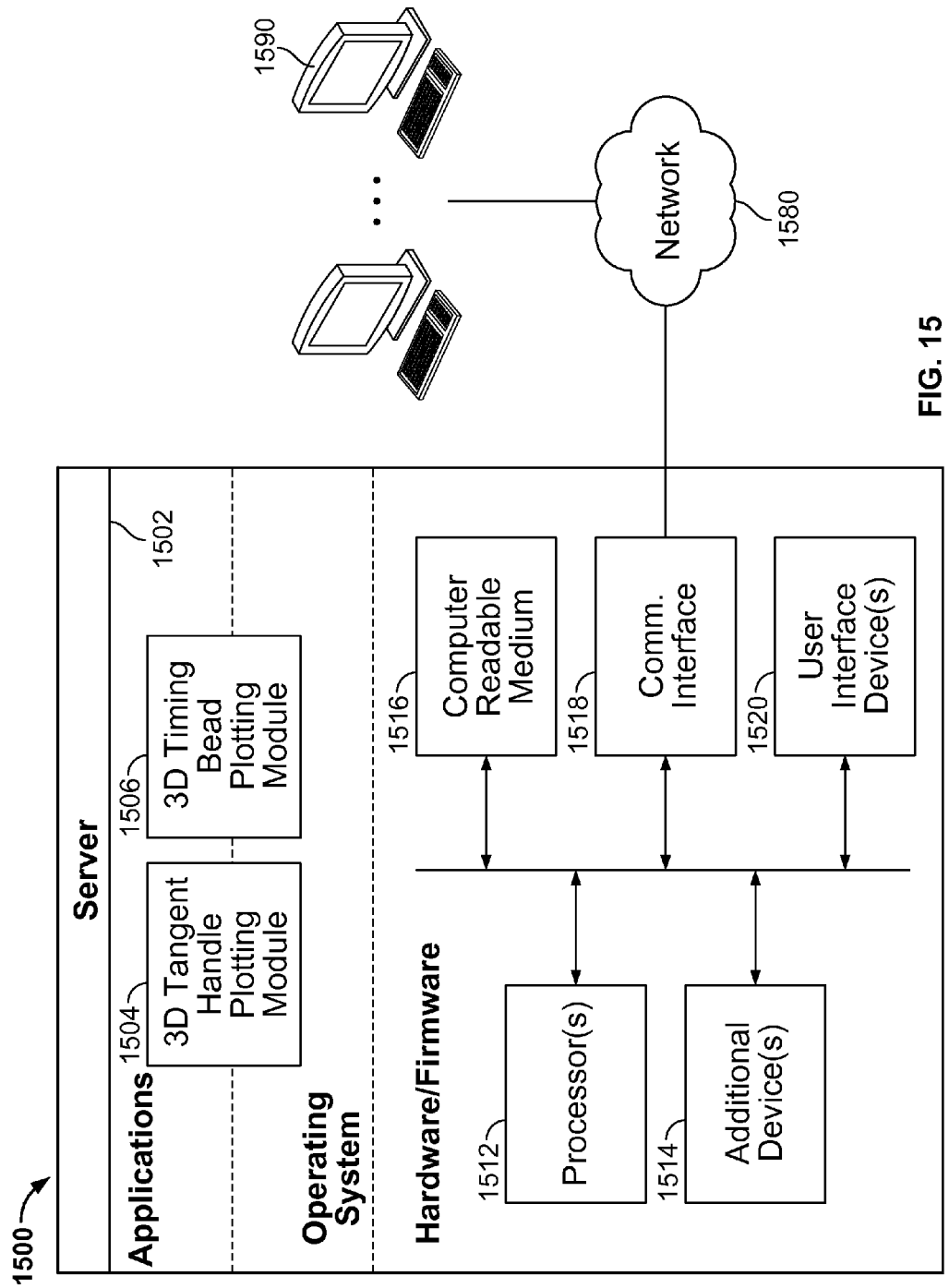
FIG. 15 is a schematic diagram of a generic computer system.

FIG. 12 is a flow diagram illustrating an example process 1200 for manipulating an object's motion trajectory and trajectory timing in a view of a 3D computer animation model. The process 1200 can be performed by a data processing apparatus, such as, for example, the system 1500, as shown in FIG. 15.

The system provides a graphical user interface (GUI) configured to present a view of a three-dimensional computer animation model. The computer animation model includes one or more objects, wherein each of the one or more objects is associated with a respective animation setting for adjusting a respective three-dimensional motion trajectory interpolation of the object in the computer animation model between a first and a different second key frame (1202). For example, the system can provide a GUI similar to the GUI described in reference to FIGS. 1-11.

The GUI can present a view of a 3D computer animation model, including one or more objects in the computer animation model. The view of the computer animation model can also visually depict motion trajectory trails for the one or more objects, the motion trajectory trails indicating an object's position, in world space, during animation. In particular, a motion trajectory trail for an object can be plotted in the view using data, e.g., key frames, from the object's Bezier curves, as represented in two-dimensional (2D) space.

Key frames corresponding to the object's Bezier curves can be used to control animation of the object at a particular point in time. A user can manipulate an object's motion trajectory trail by manipulating the positions of key frames in the view of the computer animation model. Frame numbers corresponding to the plotted key frames can be visually depicted in the view to provide reference points along the motion trajectory trail. Additionally, modifications made to a particular object's motion trajectory trail in the view can be mapped to the object's Bezier curves in 2D space, such that changes made to the object's motion trajectory in the view or in 2D space are synchronized.

The objects presented in the view of the computer animation model can be associated with animation settings for adjusting a respective motion trajectory interpolation of the object between two or more key frames. In some implementations, adjusting a motion trajectory interpolation of an object includes adjusting the object's motion trajectory as the object travels along a motion trajectory trail in the view of the computer animation model.

The motion trajectory of an object can be adjusted in the view of the computer animation model using one or more tangent handles that correspond to a particular position, e.g., a key frame, on the motion trajectory trail. Tangent handles can be classified as "in" tangent handles and "out" tangent handles. An "in" tangent handle can be used to manipulate an object's motion trajectory as the object travels along the motion trajectory trail towards the selected position. An "out" tangent handle can be used to manipulate an object's motion trajectory as the object travels along the motion trajectory trail away from the selected position to a point subsequent to the selected position.

Tangent handles can be classified as non-weighted and weighted. For non-weighted tangent handles, the length of the tangent handle is fixed, such that only the angle of the tangent handle can be adjusted. Non-weighted tangent handles can be depicted in the view of the computer animation model as a line and a point emitting in and out from a particular key frame, depending on whether the tangent handle is an "in" tangent handle or an "out" tangent handle. Bezier curves corresponding to a motion trajectory trail can be used to map a tangent handle from 2D space into a visual representation of the tangent handle in the view of the computer animation model, as described in more detail with respect to FIG. 13. In some implementations, a tangent handle can be manipulated by adjusting the angle of the tangent handle, e.g., by dragging the tangent handle in the view of the computer animation model from a first position to a second position using a mouse pointer. The non-weighted tangent handle can be manipulated in the view of the computer animation model to change both the curvature and the timing of an object's trajectory.

For weighted tangent handles, the length of the tangent is variable and can be adjusted separately with respect to curvature and timing. Similar to non-weighted tangent handles, weighted tangent handles can be depicted in the view of the computer animation model as a line and a point emitting in and out from a particular key frame, depending on whether the tangent handle is an "in" tangent handle or an "out" tangent handle. Unlike weighted tangent handles, however, the non-weighted tangent handle can be manipulated in the view of the computer animation model to change the curvature of an object's trajectory, but not the timing.

In some implementations, an object's motion trajectory timing, e.g., the speed the object travels across a particular segment in the motion trajectory trail, can be adjusted in the view of the computer animation model. In such implementations, timing beads can be provided with weighted tangent handles to allow adjustment of an object's trajectory timing. The timing beads can be provided for a particular position along a motion trajectory trail in the view of the computer animation model. Timing beads can be classified as "in" timing beads and "out" timing beads. "In" timing beads corresponding to a particular position can be used to adjust an object's trajectory time as the object approaches the particular position while traveling along the motion trajectory trail. "Out" timing beads corresponding a particular point can be used to adjust an object's trajectory time as the object travels away from the particular position along the motion trajectory trail. Bezier curves corresponding to a motion trajectory trail can be used to map an object's trajectory timing from 2D space into a visual representation of the trajectory timing, e.g., using timing beads, in the view of the computer animation model, as described in more detail with respect to FIG. 14.

The system receives data describing a user interaction with a visual representation of the animation setting in the graphical user interface for a first object of the one or more objects, the user interaction being an adjustment of the respective animation setting of a first object of the one or more objects (1204).

In some implementations, tangent handles can be adjusted by adjusting an angle of the tangent handle in the view of the computer animation model. The angle of an "in" tangent handle corresponding to a second position can be adjusted to manipulate an object's motion trajectory as the object travels along a motion trajectory trail from a first position toward the second position. Similarly, an angle of an "out" tangent handle corresponding to a first position can be adjusted to manipulate an object's motion trajectory as the object travels along a motion trajectory trail from the first position to a second position.

In some implementations, timing beads can be adjusted by sliding the timing beads, e.g., by dragging the timing beads using a mouse pointer, toward a first position from which the timing beads originate, or toward a second position. In some implementations, sliding the timing beads toward the first position from which the timing beads originate can decrease the speed the object travels across a motion trajectory trail. Alternatively, sliding the timing beads toward the second position can increase the speed the object travels across the motion trajectory trail. Depending on the configuration, two or more timing beads can be presented and used for adjustment of an object's motion trajectory timing along a particular segment in a motion trajectory trail.

Based on the receiving, the system adjusts the motion trajectory interpolation of the first object between the particular first and second key frames (1206). In some implementations, changes made to an object's motion trajectory and trajectory timing in 3D space can be mapped to the object's Bezier curves in 2D space. Similarly, changes made to the object's motion trajectory and trajectory timing using the object's Bezier curves in 2D space can be mapped to the visual representation of the object's motion trajectory and trajectory timing in 3D space.

The system provides an animation of the first object in the graphical user interface wherein the animation is of the first object traveling along the respective adjusted motion trajectory interpolation of the object (1208).

Figure 13:
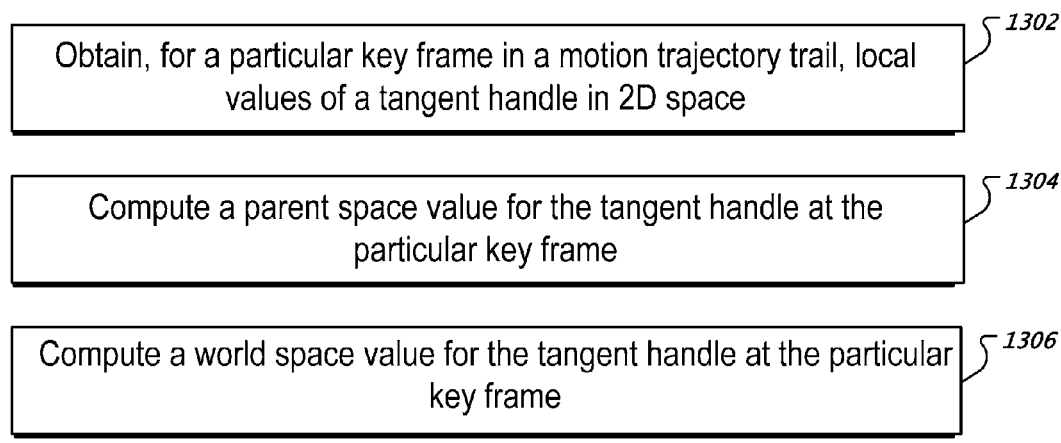
FIG. 13 is a flow diagram illustrating an example process for mapping tangent handles from two-dimensional space to a view of a three-dimensional computer animation model.

FIG. 13 is a flow diagram illustrating an example process 1300 for mapping tangent handles from 2D space to a view of a 3D computer animation model. The process 1300 can be performed by a data processing apparatus, such as, for example, the system 1300, as shown in FIG. 15.

The system obtains, for a particular key frame in a motion trajectory trail, local values of a tangent handle in 2D space (1302). For example, the system can plot on a graph Bezier curves corresponding to an object's position along an x, y, and z-axis in a Cartesian coordinate system, where the graph's x-axis represents time, and where the graph's y-axis represents a local value. The system can use the graph to obtain a local value for each of the Bezier curves corresponding to an x, y, and z-axis, at a particular point in time.

In some implementations, for non-weighted tangent handles, the system obtains and converts an internally defined value for the non-weighted tangent handles. Non-weighted tangent handles can be unit normalized, e.g., with a unit vector having a length of 1. Non-weighted tangents handles can be converted to weighted tangent handles by scaling the unit vector by a time difference between a first and second key frame. For "out" tangent handles, non-weighted tangents handles can be converted to weighted tangent handles by scaling the unit vector by a time difference between time values for a first and subsequent key frame. For "in" tangents, non-weighted tangents handles can be converted to weighted tangent handles by scaling the unit vector by a time difference between time values for a first and preceding key frame. For example, for an "out" tangent handle, a time difference can be computed by subtracting the time value for a subsequent key frame by the time value for a first key frame. The new x-value for the tangent handle can be set to the computed time difference. The new y-value for the tangent handle can be determined by dividing the old y-value for the tangent handle by the old x-value for the tangent handle, and by multiplying the result by the computed time difference.

The system computes a parent space value for the tangent handle at the particular key frame (1304). A parent space value for the tangent handle at the particular key frame can be determined by summing the local values for each of the Bezier curves corresponding to the x, y, and z-axis.

The system computes a world space value for the tangent handle at the particular key frame (1306). Objects in 3D, i.e., world, space can be defined using a directed acyclical graph (DAG), where each object is associated with a parent. Each object also has Bezier curves corresponding to the x, y, and z-axis, where the Bezier curves are defined in local space. To convert an object from local space to world space, the object's local translation, rotation, and scale are multiplied by the object's parent's world space matrix.

A world space value for the tangent handle, e.g., a vector identifying a position of the tangent handle in 3D space, at the particular key frame can be determined by multiplying the parent space value by the world transformation of the object's parent. The result is a vector that provides the location of the tangent handle in world space.

Adjustments made to a tangent handle in the view of the computer animation model can be mapped back to the local values of the tangent handle in 2D space. The mapping can be accomplished by taking an inverse transform of a vector identifying the location of the tangent handle in world space and multiplying that by the inverse of the parent's world space transform. The result is a vector of the tangent handle in parent space. To determine the local values of each tangent handle for each of the Bezier curves, the system can subtract the world space value of each key frame.

Figure 14:
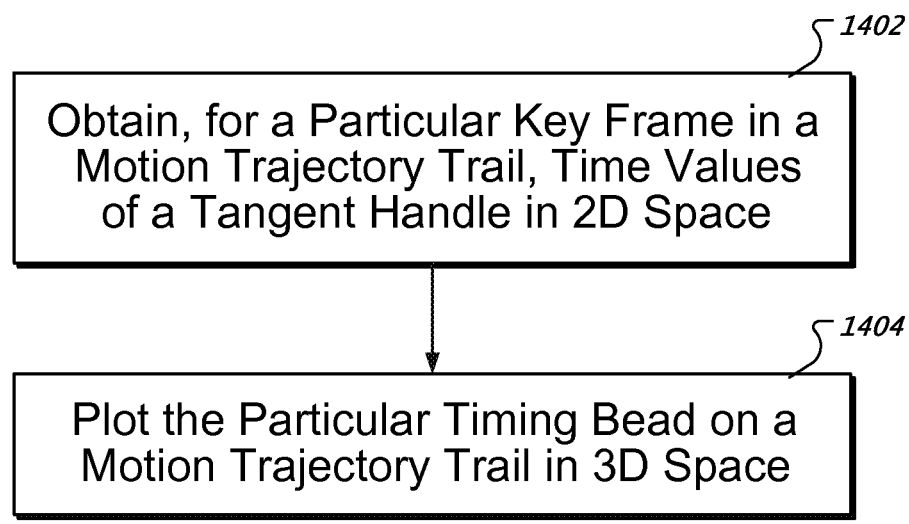
FIG. 14 is a flow diagram illustrating an example process for mapping timing beads from two-dimensional space to a view of a three-dimensional computer animation model.

FIG. 14 is a flow diagram illustrating an example process 1300 for mapping timing beads from two-dimensional (2D) space to a view of a 3D computer animation model. The process 1400 can be performed by a data processing apparatus, such as, for example, the system 1500, as shown in FIG. 15.

The system obtains, for a particular key frame in a motion trajectory trail, time values of a tangent handle in 2D space (1402). For example, the system can plot on a graph Bezier curves corresponding to an object's position along an x, y, and z-axis in a Cartesian coordinate system, where the graph's x-axis represents time, and where the graph's y-axis represents a local value, as described in reference to FIG. 11. The system can use the graph to obtain a time value for a particular tangent handle using the Bezier curves corresponding to an x, y, and z-axis.

The time values for the particular tangent handle may vary across the Bezier curves corresponding to an x, y, and z-axis. In some implementations, for an "in" tangent handle, a timing bead position at the particular key frame is determined by using the minimum time value as the bead time for the particular tangent handle across the Bezier curves. The system maintains ratios of time values corresponding to the other tangent handles for the Bezier curves. For an "out" tangent handle, a timing bead position at the particular key frame is determined by using the maximum time value as the bead time for the particular tangent handle across the Bezier curves, e.g., the curve along the x-axis. The system maintains ratios of time values corresponding to the other tangent handles, e.g., the curves along the y and z axis. The ratios of time values for the other tangent handles are used to adjust the other tangent handles in the 2D space as a timing bead is manipulated in the 3D space, e.g., by dragging the timing bead using a mouse pointer.

The system plots the particular timing bead on a motion trajectory trail in 3D space (1404). In some implementations, the motion trajectory trail in 3D space is composed of a series of line segments in between 3D points in time that are plotted using values from the Bezier curves corresponding to an x, y, and z-axis. Each of the 3D points in time are stored in an index of 3D values with a start time and a time increment, for example. The system plots the particular timing bead on the trajectory trail by obtaining an index for the 3D point at a particular time and plotting the timing bead at the 3D point corresponding to the index. One example method of obtaining an index for the 3D point at a particular time is:

$$\text{index} = \left(\text{bead time} - \frac{\text{motion trail start time}}{\text{time increment}}\right)$$

In some implementations, the system plots additional timing beads, e.g., 4 timing beads, along the motion trajectory trail. The additional timing beads can be positioned proportionally based on the minimum and maximum time values for the particular tangent handle. For example, for a particular "in" tangent handle bead of the x-value of the Bezier curves having a minimum time value of 10, and where the key frame corresponding to the "in" tangent handle has a time value of 15, a group of five timing beads can be positioned at time values 10, 11, 12, 13, and 14. Each of the five timing beads can be manipulated, e.g., dragged using a mouse pointer.

In some implementations, when a particular timing bead is manipulated, e.g., dragged using a mouse pointer, the system performs a hit test against the motion trajectory trail to identify a position to where the timing bead was dragged. The hit test provides an index of the motion trajectory trail line segment that is being drawn and, based on the identified line segment, the system determines a modified bead time for the position to which the timing bead was dragged. The system can determine a change in ratios from the original bead time and the modified bead time and applies the change to all three of the x, y, and z tangent handles for the Bezier curves.

FIG. 15 is a schematic diagram of an example server 1502. The server 1502 is optionally connected to one or more user or client computers 1590 through a network 1580. The server 1502 consists of one or more data processing apparatuses. While only one data processing apparatus is shown in FIG. 15, multiple data processing apparatus can be used. The server 1502 includes various software modules, e.g. executable software programs or libraries, including one or more of: a three-dimensional tangent handle plotting module 1504 and a three-dimensional timing bead plotting module 1506. Although several software modules are illustrated, there may be fewer or more software modules. Moreover, the software modules can be distributed on one or more data processing apparatus connected by one or more networks or other suitable communication mediums.

The server 1502 also includes hardware or firmware devices including one or more processors 1512, one or more additional devices 1514, a computer readable medium 1516, a communication interface 1518, and one or more user interface devices 1520. Each processor 1512 is capable of processing instructions for execution within the server 1502. In some implementations, the processor 1512 is a single or multi-threaded processor. Each processor 1512 is capable of processing instructions stored on the computer readable medium 1516 or on a storage device such as one of the additional devices 1514. The server 1502 uses its communication interface 1518 to communicate with one or more computers 1590, for example, over a network 1580. Examples of user interface devices 1520 include a display, a camera, a speaker, a microphone, a tactile feedback device, a keyboard, and a mouse. The server 1502 can store instructions that implement operations associated with the modules described above, for example, on the computer readable medium 1516 or one or more additional devices 1514, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer-implemented method, the method comprising:
concurrently presenting (1) a three-dimensional world space view of a computer animation model in a coordinate system, the world space view including a three-dimensional rendering of an object and a three-dimensional motion trail of the object between a first key frame point on the three-dimensional motion trail within the world space view and a second key frame point on the three-dimensional motion trail within the world space view, wherein the first key frame point is associated with a first tangent handle for a user to adjust the three-dimensional motion trail of the object within the world space view, and (2) a two-dimensional graph editor that presents one or more curves, each curve representing a motion trail of the object along a respective axis of the coordinate system over time, and wherein the graph editor presents the first key frame point on a first curve of the graph editor;
receiving, within the three-dimensional world space view, user input of a first adjustment to the first tangent handle of the first key frame point on the three-dimensional motion trail within the world space view;
determining a second adjustment to a second tangent handle of the first key frame point within the two-dimensional graph editor, the second adjustment corresponding to the user input within the three-dimensional world space view of the first adjustment to the first tangent handle of the first key frame point on the three-dimensional motion trail within the world space view; and
concurrently presenting the first tangent handle on the motion trail within the world space view according to the first adjustment and presenting the second tangent handle on the curve within the graph editor according to the second adjustment to the second tangent handle corresponding to the first adjustment to the first tangent handle.

2. The method of claim 1, wherein concurrently presenting the second tangent handle on the curve within the graph editor according to the second adjustment corresponding to the first adjustment comprises concurrently presenting an update to the curve representing the motion trail along a particular axis over time.

3. The method of claim 2, wherein concurrently presenting an update to the curve representing the motion trail along a particular axis over time comprises concurrently presenting updates to an x-axis Bezier curve, a y-axis Bezier curve, and a z-axis Bezier curve within the graph editor, the updates corresponding to the second adjustment of the second tangent handle within the graph editor.

4. The method of claim 1, further comprising:
receiving user input of a third adjustment to the second tangent handle on the curve within the graph editor;
determining a fourth adjustment to the first tangent handle of the first key frame point within the world space view, the fourth adjustment corresponding to the user input of the third adjustment to the second tangent handle of the first key frame point within the graph editor; and
concurrently presenting the second tangent handle on the curve within the graph editor according to the third adjustment and presenting the first tangent handle on the motion trail within the world space view according to the fourth adjustment corresponding to the third adjustment.

5. The method of claim 4, wherein determining the fourth adjustment to the first tangent handle comprises:
obtaining local values of the second tangent handle on the curve;
determining a parent space value for the second tangent handle including summing local values of the second tangent handle along an x-axis Bezier curve, a y-axis Bezier curve, and a z-axis Bezier curve; and
multiplying the parent space value by a world transformation matrix of a parent of the object.

6. The method of claim 1, wherein the first tangent handle is a weighted tangent handle, and wherein determining the second adjustment to the second tangent handle in the graph editor comprises adjusting the timing of the curve in the graph editor according to the second adjustment.

7. The method of claim 1, wherein the first tangent handle is a non-weighted tangent handle, and wherein determining the second adjustment to the second tangent handle in the graph editor comprises scaling a unit vector by a time difference between time values associated with the first key frame point and the second key frame point.

8. The method of claim 1, wherein determining the second adjustment to the second tangent handle of the first key frame point within the graph editor comprises:
identifying a location of the first tangent handle in the world space;
determining a parent space vector of the first tangent handle in a parent space including multiplying the location of the first tangent handle in the world space by an inverse of a world space transform of a parent of the object; and
determining local values of the first tangent handle including subtracting world space values of the first key frame point from the parent space vector of the first tangent handle.

9. A computer program product, encoded on one or more non-transitory computer storage media, comprising instructions that when executed by one or more computers cause the one or more computers to perform operations comprising;
concurrently presenting (1) a three-dimensional world space view of a computer animation model in a coordinate system, the world space view including a three-dimensional rendering of an object and a three-dimensional motion trail of the object between a first key frame point on the three-dimensional motion trail within the world space view and a second key frame point on the three-dimensional motion trail within the world space view, wherein the first key frame point is associated with a first tangent handle for a user to adjust the three-dimensional motion trail of the object within the world space view, and (2) a two-dimensional graph editor that presents one or more curves, each curve representing a motion trail of the object along a respective axis of the coordinate system over time, and wherein the graph editor presents the first key frame point on a first curve of the graph editor;
receiving, within the three-dimensional world space view, user input of a first adjustment to the first tangent handle of the first key frame point on the three-dimensional motion trail within the world space view;
determining a second adjustment to a second tangent handle of the first key frame point within the two-dimensional graph editor, the second adjustment corresponding to the user input within the three-dimensional world space view of the first adjustment to the first tangent handle of the first key frame point on the three-dimensional motion trail within the world space view; and concurrently presenting the first tangent handle on the motion trail within the world space view according to the first adjustment and presenting the second tangent handle on the curve within the graph editor according to the second adjustment to the second tangent handle corresponding to the first adjustment to the first tangent handle.

10. The computer program product of claim 9, wherein concurrently presenting the second tangent handle on the curve within the graph editor according to the second adjustment corresponding to the first adjustment comprises concurrently presenting an update to the curve representing the motion trail along a particular axis over time.

11. The computer program product of claim 10, wherein concurrently presenting an update to the curve representing the motion trail along the particular axis over time comprises concurrently presenting updates to an x-axis Bezier curve, a y-axis Bezier curve, and a z-axis Bezier curve within the graph editor, the updates corresponding to the second adjustment of the second tangent handle within the graph editor.

12. The computer program product of claim 9, wherein the operations further comprise:
receiving user input of a third adjustment to the second tangent handle on the curve within the graph editor;
determining a fourth adjustment to the first tangent handle of the first key frame point within the world space view, the fourth adjustment corresponding to the user input of the third adjustment to the second tangent handle of the first key frame point within the graph editor; and
concurrently presenting the second tangent handle on the curve within the graph editor according to the third adjustment and presenting the first tangent handle on the motion trail within the world space view according to the fourth adjustment corresponding to the third adjustment.

13. The computer program product of claim 12, wherein determining the fourth adjustment to the first tangent handle comprises:
obtaining local values of the second tangent handle on the curve;
determining a parent space value for the second tangent handle including summing local values of the second tangent handle along an x-axis Bezier curve, a y-axis Bezier curve, and a z-axis Bezier curve; and
multiplying the parent space value by a world transformation matrix of a parent of the object.

14. The computer program product of claim 9, wherein the first tangent handle is a weighted tangent handle, and wherein determining the second adjustment to the second tangent handle in the graph editor comprises adjusting the timing of the curve in the graph editor according to the second adjustment.

15. The computer program product of claim 9, wherein the first tangent handle is a non-weighted tangent handle, and wherein determining the second adjustment to the second tangent handle in the graph editor comprises scaling a unit vector by a time difference between time values associated with the first key frame point and the second key frame point.

16. The computer program product of claim 9, wherein determining the second adjustment to the second tangent handle of the first key frame point within the graph editor comprises:
identifying a location of the first tangent handle in the world space;
determining a parent space vector of the first tangent handle in a parent space including multiplying the location of the first tangent handle in the world space by an inverse of a world space transform of a parent of the object; and
determining local values of the first tangent handle including subtracting world space values of the first key frame point from the parent space vector of the first tangent handle.

17. A system comprising:
one or more computers and one or more storage devices storing instructions that are operable, when executed by the one or more computers, to cause the one or more computers to perform operations comprising:
concurrently presenting (1) a three-dimensional world space view of a computer animation model in a coordinate system, the world space view including a three-dimensional rendering of an object and a three-dimensional motion trail of the object between a first key frame point on the three-dimensional motion trail within the world space view and a second key frame point on the three-dimensional motion trail within the world space view, wherein the first key frame point is associated with a first tangent handle for a user to adjust the three-dimensional motion trail of the object within the world space view, and (2) a two-dimensional graph editor that presents one or more curves, each curve representing a motion trail of the object along a respective axis of the coordinate system over time, and wherein the graph editor presents the first key frame point on a first curve of the graph editor;
receiving, within the three-dimensional world space view, user input of a first adjustment to the first tangent handle of the first key frame point on the three-dimensional motion trail within the world space view;
determining a second adjustment to a second tangent handle of the first key frame point within the two-dimensional graph editor, the second adjustment corresponding to the user input within the three-dimensional world space view of the first adjustment to the first tangent handle of the first key frame point on the three-dimensional motion trail within the world space view; and
concurrently presenting the first tangent handle on the motion trail within the world space view according to the first adjustment and presenting the second tangent handle on the curve within the graph editor according to the second adjustment to the second tangent handle corresponding to the first adjustment to the first tangent handle.

18. The system of claim 17, wherein concurrently presenting the second tangent handle on the curve within the graph editor according to the second adjustment corresponding to the first adjustment comprises concurrently presenting an update to the curve representing the motion trail along a particular axis over time.

19. The system of claim 18, wherein concurrently presenting an update to the curve representing the motion trail along the particular axis over time comprises concurrently presenting updates to an x-axis Bezier curve, a y-axis Bezier curve, and a z-axis Bezier curve within the graph editor, the updates corresponding to the second adjustment of the second tangent handle within the graph editor.

20. The system of claim 17, wherein the operations further comprise:
receiving user input of a third adjustment to the second tangent handle on the curve within the graph editor;
determining a fourth adjustment to the first tangent handle of the first key frame point within the world space view, the fourth adjustment corresponding to the user input of the third adjustment to the second tangent handle of the first key frame point within the graph editor; and concurrently presenting the second tangent handle on the curve within the graph editor according to the third adjustment and presenting the first tangent handle on the motion trail within the world space view according to the fourth adjustment corresponding to the third adjustment.

21. The system of claim 20, wherein determining the fourth adjustment to the first tangent handle comprises:

obtaining local values of the second tangent handle on the curve;

determining a parent space value for the second tangent handle including summing local values of the second tangent handle along an x-axis Bezier curve, a y-axis Bezier curve, and a z-axis Bezier curve; and multiplying the parent space value by a world transformation matrix of a parent of the object.

22. The system of claim 17, wherein the first tangent handle is a weighted tangent handle, and wherein determining the second adjustment to the second tangent handle in the graph editor comprises adjusting the timing of the curve in the graph editor according to the second adjustment.

23. The system of claim 17, wherein the first tangent handle is a non-weighted tangent handle, and wherein determining the second adjustment to the second tangent handle in the graph editor comprises scaling a unit vector by a time difference between time values associated with the first key frame point and the second key frame point.

24. The system of claim 17, wherein determining the second adjustment to the second tangent handle of the first key frame point within the graph editor comprises:

identifying a location of the first tangent handle in the world space;

determining a parent space vector of the first tangent handle in a parent space including multiplying the location of the first tangent handle in the world space by an inverse of a world space transform of a parent of the object; and determining local values of the first tangent handle including subtracting world space values of the first key frame point from the parent space vector of the first tangent handle.

* * * * *

UNITED STATES PATENT AND TRADEMARK OFFICE
CERTIFICATE OF CORRECTION

PATENT NO. : 9,305,386 B2
APPLICATION NO. : 13/546685
DATED : April 5, 2016
INVENTOR(S) : Michael Zyracki et al.

Page 1 of 1

It is certified that error appears in the above-identified patent and that said Letters Patent is hereby corrected as shown below:

In the claims,

In column 18, line 41, claim 9: Please delete "comprising;" and insert --comprising:--, therefor.

Signed and Sealed this
Seventh Day of June, 2016

Michelle K. Lee
*Director of the United States Patent and Trademark Office*